United States Patent
Hoogendam et al.

(10) Patent No.: US 8,773,641 B2
(45) Date of Patent: Jul. 8, 2014

(54) LEAF SPRING, STAGE SYSTEM, AND LITHOGRAPHIC APPARATUS

(75) Inventors: Christiaan Alexander Hoogendam, Westerhoven (NL); Martinus Agnes Willem Cuijpers, Veldhoven (NL); Bart Friso Riedstra, Breda (NL); Ronald Cornelis Gerardus Gijzen, Liempde (NL); Maikel Cornelis Andreas Bruin, Enschede (NL)

(73) Assignee: ASML Netherlands B.V., Veldhoven (NL)

( * ) Notice: Subject to any disclaimer, the term of this patent is extended or adjusted under 35 U.S.C. 154(b) by 358 days.

(21) Appl. No.: 13/281,229

(22) Filed: Oct. 25, 2011

(65) Prior Publication Data

US 2012/0105817 A1 May 3, 2012

Related U.S. Application Data

(60) Provisional application No. 61/407,334, filed on Oct. 27, 2010.

(51) Int. Cl.
  *G03B 27/58* (2006.01)
  *F16F 1/10* (2006.01)
(52) U.S. Cl.
  CPC ........................................ *F16F 1/10* (2013.01)
  USPC ............................................................ 355/72
(58) Field of Classification Search
  CPC ............ G03F 7/70716; G03F 7/70758; G03F 7/70833; F16F 1/10
  USPC .............................................. 355/53, 72–75
  See application file for complete search history.

(56) References Cited

U.S. PATENT DOCUMENTS

| 6,040,675 | A | 3/2000 | Ono |
| 6,873,478 | B2 * | 3/2005 | Watson ........................ 359/819 |
| 6,950,569 | B2 * | 9/2005 | Smith ............................. 385/16 |
| 7,492,440 | B2 | 2/2009 | Zaal et al. |

(Continued)

FOREIGN PATENT DOCUMENTS

| CN | 201106649 | 8/2008 |
| EP | 1104513 | 10/2002 |

(Continued)

OTHER PUBLICATIONS

Korean Office Action dated Mar. 26, 2013 in corresponding Korean Patent Application No. 10-2011-0109173.

*Primary Examiner* — Hung Henry Nguyen
(74) *Attorney, Agent, or Firm* — Pillsbury Winthrop Shaw Pittman LLP

(57) ABSTRACT

A leaf spring to be mounted between two objects, the leaf spring configured to have a high stiffness in two orthogonal directions, and a relative low stiffness in other degrees of freedom, wherein the leaf spring has a substantially panel-shaped body, the leaf spring including a first mounting location at or near the center of the panel-shaped body to mount the leaf spring to a first of the two objects, wherein the leaf spring includes one or more second mounting locations at or near the circumference of the panel-shaped body to mount the leaf spring to the second of the two objects, and elongate grooves and/or slits in the panel shaped body between the first mounting location and the second mounting location, the grooves and/or slits running in at least two non-orthogonal directions in the plane of the two orthogonal directions.

17 Claims, 3 Drawing Sheets

(56) References Cited

U.S. PATENT DOCUMENTS

| | | |
|---|---|---|
| 2006/0049698 A1 | 3/2006 | Zaal et al. |
| 2006/0153556 A1 | 7/2006 | Lee et al. |
| 2007/0081141 A1* | 4/2007 | Cornelissen et al. ........... 355/72 |

FOREIGN PATENT DOCUMENTS

| | | |
|---|---|---|
| JP | S51-74529 | 6/1976 |
| JP | S61-178560 | 11/1986 |
| JP | 2001023896 A | 1/2001 |
| JP | 2001230173 A | 8/2001 |
| JP | 2001-267220 | 9/2001 |
| JP | 2003-247580 | 9/2003 |
| JP | 2006-080527 | 3/2006 |
| JP | 2009-210897 | 9/2009 |
| TW | M303484 | 12/2006 |
| TW | 200944862 | 11/2009 |
| TW | 200946795 | 11/2009 |

* cited by examiner

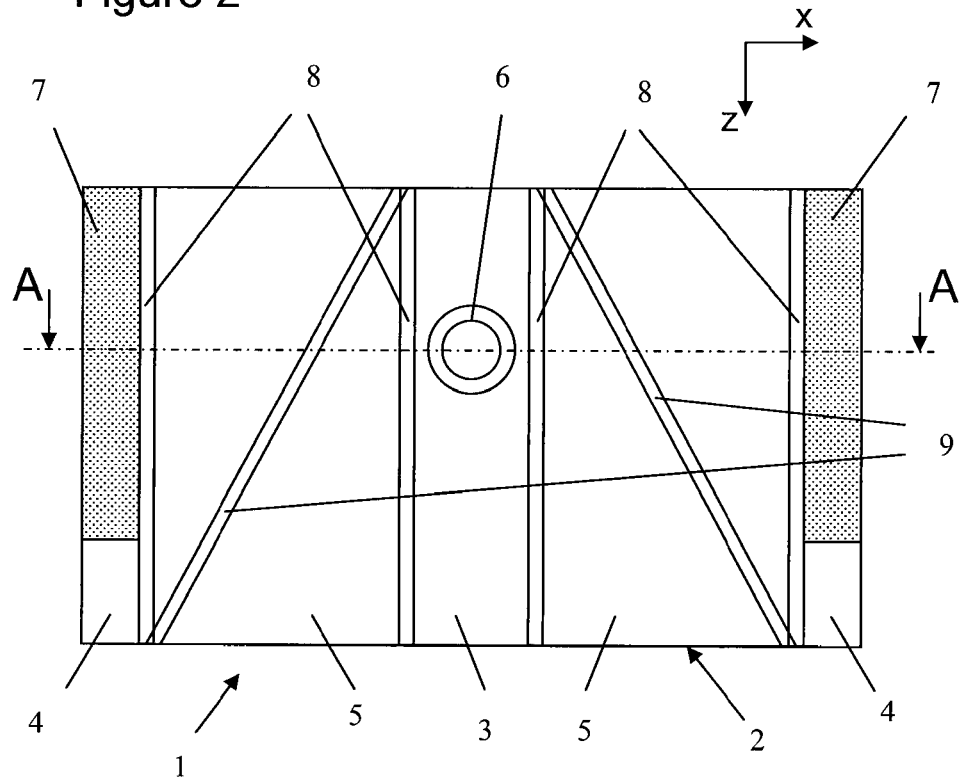
Figure 2
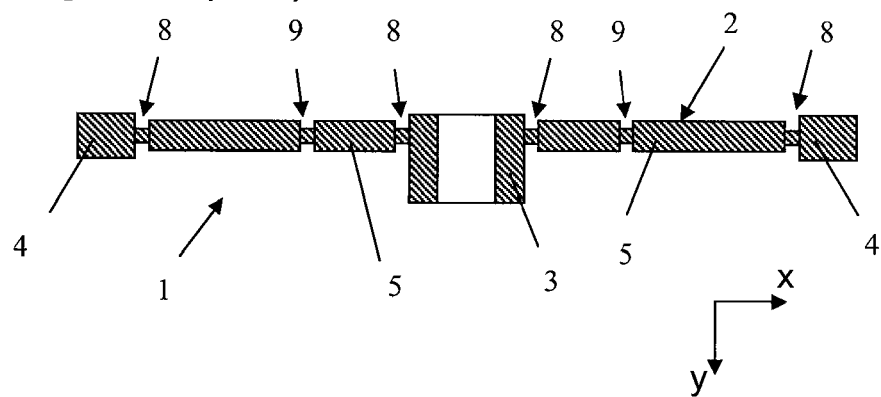
Figure 3 (A-A)

Figure 4
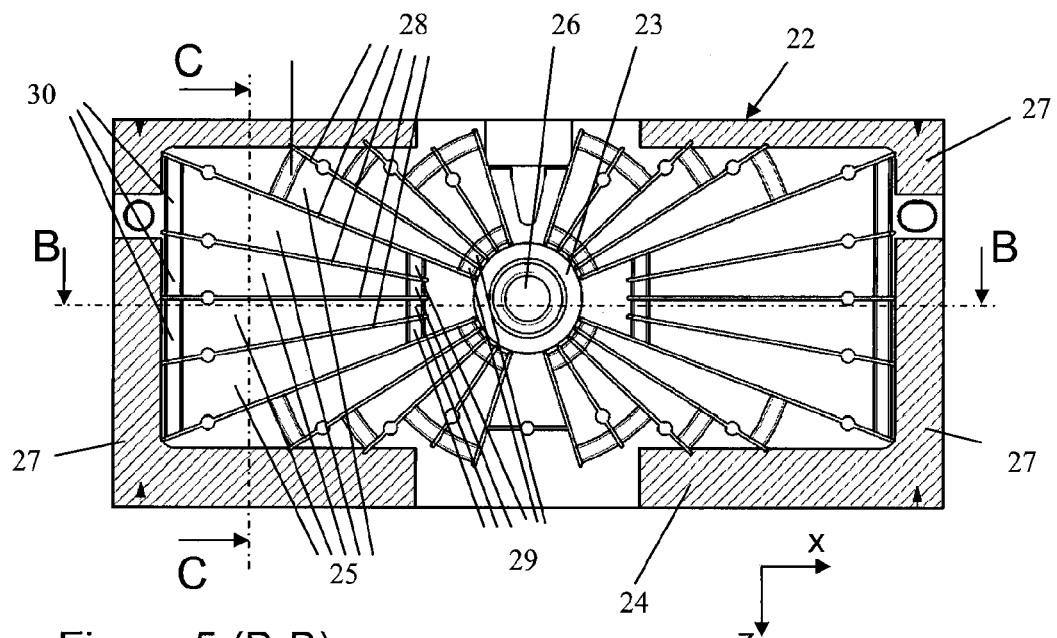
Figure 5 (B-B)
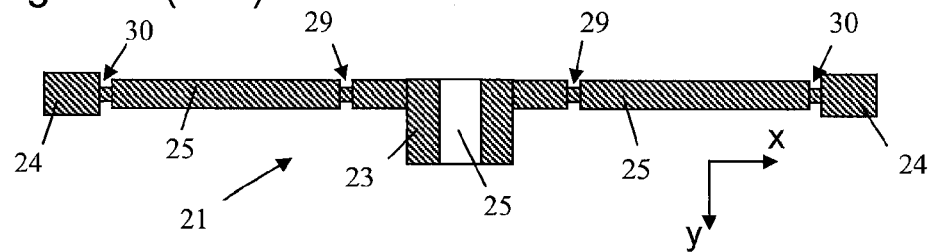
Figure 6 (C-C)
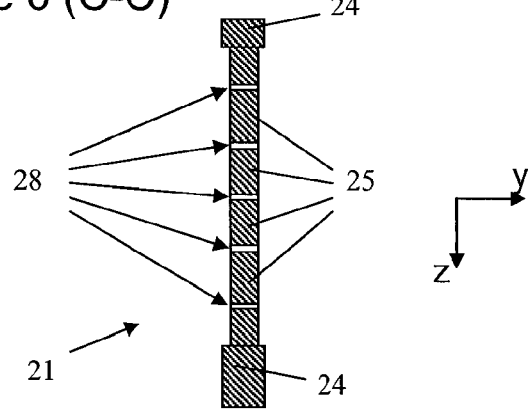

LEAF SPRING, STAGE SYSTEM, AND LITHOGRAPHIC APPARATUS

CROSS REFERENCE TO RELATED APPLICATIONS

This application claims priority and benefit under 35 U.S.C. §119(e) to U.S. Provisional Patent Application No. 61/407,334, entitled "Leaf Spring, Stage System, and Lithographic Apparatus", filed on Oct. 27, 2010. The content of that application is incorporated herein in its entirety by reference.

FIELD

The present invention relates to a leaf spring, a stage system of a lithographic apparatus, and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In stage systems of a lithographic apparatus, for instance in a substrate or wafer stage, leaf springs are used to mount one object of the stage to another object of the stage. In particular leaf springs are used to mount a magnet yoke, which is part of a motor of the stage, in a mirror block of the wafer stage. The leaf springs are used to minimize over determined fixation of the minor block with respect to the magnet yoke. The leaf spring has a plane-shaped body which provides a relative high stiffness in the plane of the body. By providing three leaf springs in different orientations between the yoke and the mirror block, the motor can be mounted stiff in six degrees of freedom in the mirror block.

To avoid an over determined fixation the leaf spring should provide relative stiff connection in two orthogonal directions, while the leaf spring should provide very low stiffness in all other degrees of freedom. In this way deformation as a consequence of manufacturing errors, difference in coefficient of thermal expansion in the motor and minor block, possible hysteresis in serial connections during large crash loads, etc may be avoided.

The leaf spring is connected to the minor block using glue. As a consequence, the choice of material for the leaf spring is mainly determined by the coefficient of thermal expansion of the material. This results for instance in a choice of Invar as material for the leaf spring. However, other material properties of Invar determining the achievable stiffness ratios between the different directions are relatively poor.

With this known construction it is not possible to achieve the desired high stiffness in two orthogonal directions, while at the same time the stiffness in other degrees of freedom is weak enough. Thus, the construction of the leaf spring is still over determined.

SUMMARY

It is desirable to provide a leaf spring having a relative high stiffness in two orthogonal directions, and a relative low stiffness in other degrees of freedom.

According to an embodiment of the invention, there is provided a leaf spring to be mounted between two objects wherein the leaf spring is configured to have a high stiffness in two orthogonal directions, and a relative low stiffness in other degrees of freedom, wherein the leaf spring has a substantially panel-shaped body, wherein the leaf spring comprises a first mounting location in or near the center of the panel-shaped body to mount the leaf spring to a first of the two objects, wherein the leaf spring comprises one or more second mounting locations at or near the circumference of the panel-shaped body to mount the leaf spring to the second of the two objects, and wherein the leaf spring comprises elongate grooves and/or slits in the panel shaped body between the first mounting location and the second mounting location, the grooves and/or slits running in at least two non-orthogonal directions in the plane of the two orthogonal directions.

According to an embodiment of the invention, there is provided a stage system comprising a first stage part and a second stage part, wherein the first stage part is mounted on the second stage part with one or more leaf springs, wherein each leaf spring is configured to have a high stiffness in two orthogonal directions, and a relative low stiffness in other degrees of freedom, wherein the leaf spring has a substantially panel-shaped body, wherein the leaf spring comprises a first mounting location in or near the center of the panel-shaped body to mount the leaf spring to the first stage part, wherein the leaf spring comprises one or more second mounting locations at or near the circumference of the panel-shaped body to mount the leaf spring to the second stage part, and wherein the leaf spring comprises elongate grooves and/or slits in the panel shaped body between the first mounting location and the second mounting location, the grooves and/or slits running in at least two non-orthogonal directions in the plane of the two orthogonal directions, wherein the first stage part is connected to the first mounting location of each leaf spring, and wherein the one or more second mounting locations are connected to the second stage part.

According to an embodiment of the invention, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus comprises a stage system, wherein the stage system comprises a first stage part and a second stage part, wherein the first stage part is mounted on the second stage part with one or more leaf springs, wherein each leaf spring is configured to have a high stiffness in two orthogonal directions, and a relative low stiffness in other degrees of freedom, wherein the leaf spring has a substantially panel-shaped body,
wherein the leaf spring comprises a first mounting location in or near the center of the panel-shaped body to mount the leaf spring to the first stage part, wherein the leaf spring comprises one or more second mounting locations at or near the circumference of the panel-shaped body to mount the leaf spring to the second stage part, and wherein the leaf spring comprises elongate grooves and/or slits in the panel shaped body between the first mounting location and the second mounting location, the grooves and/or slits running in at least two non-orthogonal directions in the plane of the two orthogonal directions, wherein the first stage part is connected to the first mounting location of each leaf spring, and wherein the one or more second mounting locations are connected to the second stage part.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts schematically a first embodiment of a leaf spring according to an embodiment of the invention FIG. 3 depicts a cross-section along the line A-A in FIG. 2;

FIG. 4 depicts schematically a second embodiment of a leaf spring according to an embodiment of the invention;

FIG. 5 depicts a cross-section along the line B-B in FIG. 4;

FIG. 6 depicts a cross-section along the line C-C in FIG. 4.

DETAILED DESCRIPTION

Figure 1:
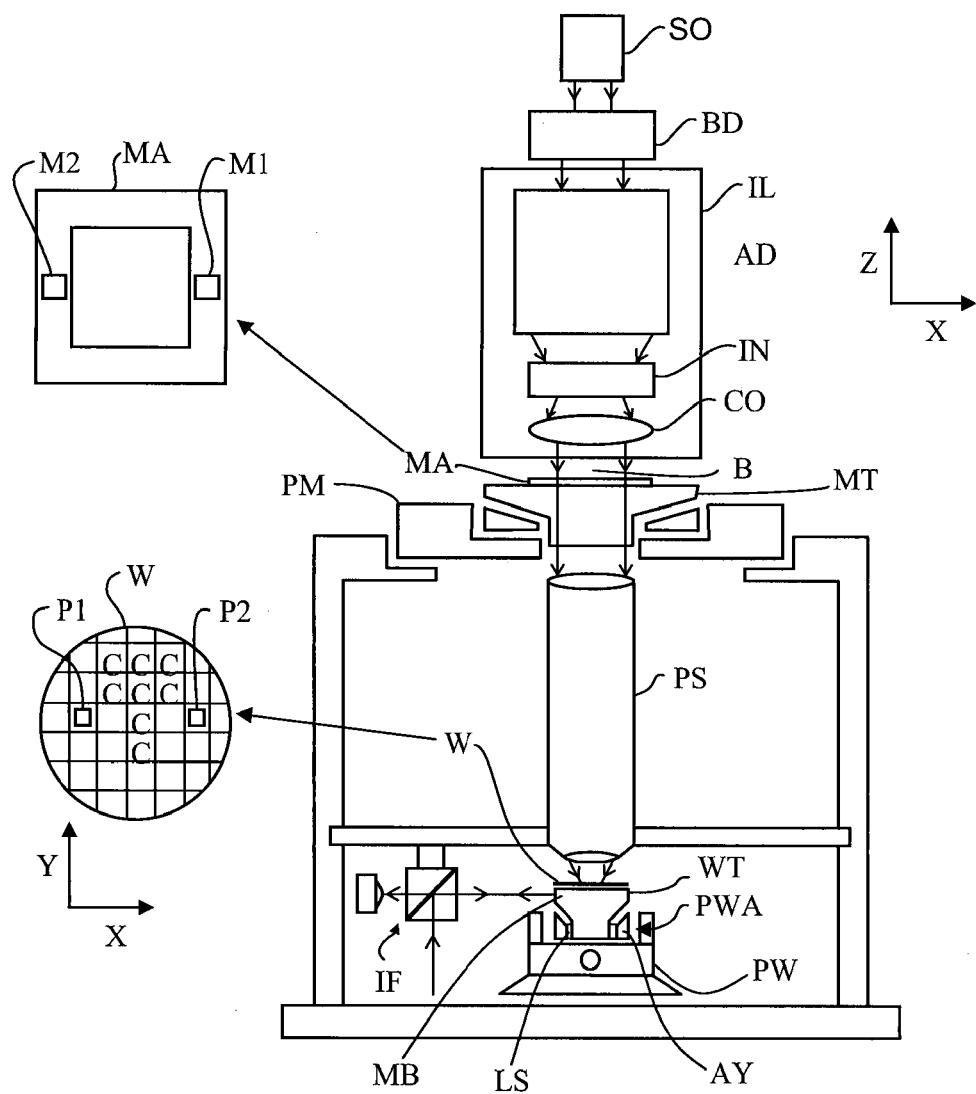
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the lithographic apparatus of FIG. 1, a second positioning device PW is configured to position the mirror block MB and wafer table WT with respect to the projection system PS. The mirror block MB comprises reflective surfaces which are used by the position sensor IF to determine a position of the mirror block.

The second positioning device PW comprises a short stroke actuator PWA to actuate the chuck supporting the wafer table WT within a relative small range but with high accuracy with respect to the projection system PS. A long stroke actuator is provided to move the short stroke actuator over a larger range. The mirror block MB is connected to a magnet yoke AY of the short stroke actuator PWA via leaf springs LS.

The leaf springs LS are used to minimize over determined fixation of the mirror block MB with respect to the magnet yoke AY. By providing three leaf springs LS in different orientations between the yoke AY and the mirror block MB, the yoke Ay can be mounted stiff in six degrees of freedom in the mirror block.

To avoid an over determined fixation, the leaf springs LS should provide relative stiff connection in two orthogonal directions, and low stiffness in other degrees of freedom. In this way, deformation as a consequence of manufacturing errors, difference in coefficient of thermal expansion in the motor and minor block, possible hysteresis in serial connections during large crash loads, etc may be avoided.

FIG. 2 shows schematically a first embodiment of a leaf spring of the invention, generally indicated by reference numeral 1. In FIG. 3 a cross-section of the leaf spring 1 along the line A-A in FIG. 2 is shown. The leaf spring 1 has a rectangular panel-shaped body 2 having a middle part 3 and two side parts 4. The side parts 4 are connected to the middle part 3 by intermediate parts 5.

The leaf spring 1 is designed to have a high stiffness in two orthogonal directions x, z in the plane of the panel-shaped body, and a relative low stiffness in other degrees of freedom (y, Rx, Rz). The stiffness in Ry is, in this embodiment, still relatively high.

The leaf spring 1 comprises a first mounting location 6 in the middle part 3 of the body 2, i.e. in or near the center of the panel-shaped body 2. This first mounting location 6 is used to connect the leaf spring 1 to the mirror block MB with a bolt or bolt-like connection. The mirror block may for instance comprise a small Invar block glued on the main mirror block, wherein the small Invar block is made suitable for a bolt connection with the leaf spring 1. As can be seen in FIG. 3, the middle part is relative thick at the location of the first mounting location 6, i.e. the opening for receiving the bolt. This relative thick part is in particular suitable for a bolt connection.

The side parts 4 each define a second mounting location 7 for connecting the leaf spring to the actuator yoke AY. This connection is in an embodiment a glue connection. However, as an alternative for or in addition to the glue connection, bolt or bolt-like connections may also be provided between the actuator yoke AY and the leaf spring 1.

Between the side parts 4 and the intermediate parts 5, and between the intermediate parts 5 and the middle part 3 first rectilinear grooves 8 running in the x-direction are provided. The first grooves 8 run over the complete width of the body 2. Further, second rectilinear grooves 9 are provided which run in a non-parallel and non-perpendicular direction with respect to the first grooves 8.

The first grooves 8 and the second grooves 9 are provided at opposite sides of the body 2, resulting in relative thin parts of the body 2 at the location of the grooves 8, 9.

The second grooves 9 run in the intermediate part 5 from one end of a groove 8 at one side of the body 2 to an end of another groove 8 at the other side of the body 2. In an embodiment, the second grooves 9 run at an angle of 30 to 60 degrees with respect to the direction of the first grooves 8, whereby first grooves 8 and second grooves 9 both run in the main plane of the panel-shaped body 2, i.e. the x-z plane.

The first grooves 8 and the second grooves 9 are schematically shown in FIGS. 2 and 3. In practice, the grooves 8, 9 may have rounded edges to avoid peak stresses in the corners of the grooves 8, 9. The grooves 8, 9 may also have any suitable cross section. In an embodiment, the grooves 8, 9 are rectilinear to provide a better flexibility to the body.

The thickness of the body 2 at the bottom of the grooves may be at least five, or in an embodiment at least ten times thinner than the rest of the body 2. For instance, the intermediate parts 5 may have a thickness of 3 mm, while the thickness of the body 2 at the bottom of the grooves 8, 9 may be 0.2 mm.

It is remarked that the known leaf spring is glued at two locations to the mirror block MB, while the leaf spring is connected to the magnet yoke AY by a single bolt connection. In the design of leaf spring 1, the mounting of the leaf spring 1 is turned around. The leaf spring 1 is mounted at a single first mounting location 6 on the mirror block MB by a bolt or bolt like connection. Two second mounting locations 7 at opposite sides of the first mounting location 6 are provided to glue the leaf spring 1 to the actuator yoke AY.

Since the leaf spring 1 is not glued to the mirror block MB, but connected with a bolt connection, the thermal coefficient of expansion of the material of the leaf spring 21 is of less importance. Therefore, the material choice of the leaf spring 1 can be more optimized with respect to the stiffness of the material. The leaf spring 1 can for instance be made of stainless steel, for instance tool steel, wolfram carbides, for instance Innermet, or a non-magnetic material such as austenitic nickel-chromium-based superalloys, for instance Inconel. The choice of non-magnetic material has the benefit of less magnetic cross-talk with other magnetic systems in the lithographic apparatus.

Another benefit of the choice of the first and second mounting locations 6, 7, is that there is only one first mounting location 6 to mount the leaf spring 1 on the mirror block MB. As a result, deformations of the leaf spring will have less effect on the mirror block MB.

FIG. 4 shows a second embodiment of a leaf spring 21 according to the invention. This leaf spring 21 is also designed to have a relative high stiffness in two orthogonal directions x, z in the plane of the panel-shaped body, and a relative low stiffness in all other degrees of freedom (y, Rx, Ry, Rz). FIGS. 5 and 6 show cross-sections of the leaf spring 21 along the lines B-B and C-C, respectively.

The leaf spring 21 has a rectangular panel-shaped body 22 having a center part 23 and a frame 24 running along the circumference of the body 22. The frame 24 is connected to the center part 23 by spoke elements 25.

The leaf spring 21 comprises a first mounting location 26 in the center part 23 of the body 22. This first mounting location 6 is used to connect the leaf spring 21 to the mirror block MB with a bolt or bolt-like connection. As can be seen in FIGS. 5 and 6, the center part 23 is relative thick at the location of the first mounting location 6 to make a firm and reliable connection between the center part 23 and the mirror block.

The frame 24 defines second mounting locations 27 for connecting the leaf spring 21 to the actuator yoke AY. This connection is in an embodiment a glue connection. The mounting locations 27 arranged at the circumference of the body 2 provide a relative large surface area to create a strong glue connection. However, as an alternative for or in addition to the glue connection, bolt or bolt-like, or other suitable connections may also be provided between the actuator yoke AY and the leaf spring 21.

The spoke elements 25 are defined by radial slits 28 extending substantially radially with respect to the first mounting location 27, and inner tangential grooves 29 and outer tangential grooves 30 extending substantially tangentially with respect to the first mounting location 27. The radial slits 28, inner tangential grooves 29 and outer tangential grooves 30 are all provided at opposite sides of the body so that the grooves form a part with a relative thin body compared to other parts such as the center part 23, frame 24, and spoke elements 25.

The radial slits 28 are rectilinear. The inner tangential grooves 29 and outer tangential grooves 30 are either rectilinear in a substantial tangential direction or run in a tangential direction.

The spoke elements 25 are substantially divided over 360 degrees about the first mounting location 26. Since the radial slits 28 and the inner and outer tangential grooves 29, 30 run in all kind of different directions within the main plane of the body 22, i.e. with respect to the x and z directions, relative flexibility is obtained in all directions except the x-direction and the z-direction. Due to the radially and tangentially orientated slits and grooves the leaf spring 21 in particular provides a good flexibility in the Ry direction, also when compared with the embodiment of FIGS. 2 and 3.

In view of this flexibility in Ry direction and other directions other than the x-direction and z-direction, it is beneficial to have substantial number of spoke elements about the circumference of the first mounting location 26, for instance at least twelve. The body 22 comprises twenty four spoke elements 25.

In the spoke design of leaf spring 21 the mounting of the leaf spring 21 with respect to the mirror block MB and the actuator yoke AY is also turned around with respect to the known leaf spring. The leaf spring 21 is mounted at a single first mounting location 26 on the mirror block MB by a bolt or bolt like connection. Second mounting locations 27 surround the first mounting location 26. The second mounting locations 27 are provided to glue the leaf spring 21 to the actuator yoke AY.

Since leaf spring 21 is not glued to the mirror block 26, the thermal coefficient of expansion of the material of the leaf spring 21 is of less importance. Therefore, the material choice of the leaf spring 21 can be more optimized with respect to the stiffness of the material. The leaf spring 21 can for instance be made of stainless steel, for instance tool steel, wolfram carbides, for instance Innermet, or a non-magnetic material such as austenitic nickel-chromium-based super alloys, for instance Inconel.

Another benefit of the choice of the first and second mounting locations 6, 7, is that there is only one mounting location 6 to mount the leaf spring 1 on the minor block MB. As a result, deformations of the leaf spring will have less effect on the minor block MB.

The term panel-shaped body is used herein to describe a body which extends substantially more in two directions, for instance length and width than in a third direction. In the embodiment shown in FIGS. 2 to 6, the body mainly extends in the x-direction and the z-direction.

Further, the terms groove and grooves are used to describe the provision of an elongate thinner part in the body to increase the flexibility of the body in one or more predetermined directions. The term slit and slits are used to describe the provision of an elongate through-going opening in the body. The grooves and slits may be machined in the body, or may be provided by moulding of the body, or be provided by any other suitable production method.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A leaf spring configured to be mounted between two objects and to have a stiffness in two orthogonal directions that is greater than a stiffness in other degrees of freedom, the leaf spring having a substantially panel-shaped body, the leaf spring comprising:
   a first mounting location at or near a center of the panel-shaped body to mount the leaf spring to a first of said two objects;
   one or more second mounting locations at or near a circumference of the panel-shaped body to mount the leaf spring to the second of said two objects; and
   elongate grooves and/or slits in said panel shaped body arranged between said first mounting location and said second mounting location, said grooves and/or slits running in at least two non-orthogonal directions in the plane of said two orthogonal directions.

2. The leaf spring of claim 1, wherein said elongate grooves and/or slits are rectilinear.

3. A leaf spring configured to be mounted between two objects and to have a stiffness in two orthogonal directions that is greater than a stiffness in other degrees of freedom, the leaf spring having a substantially panel-shaped body, the leaf spring comprising:
   a first mounting location at or near a center of the panel-shaped body to mount the leaf spring to a first of said two objects;
   one or more second mounting locations at or near a circumference of the panel-shaped body to mount the leaf spring to the second of said two objects; and
   elongate grooves and/or slits in said panel shaped body arranged between said first mounting location and said second mounting location, said grooves and/or slits running in at least two non-orthogonal directions in the plane of said two orthogonal directions, wherein said panel shaped body has a rectangular shape, wherein a middle part of the rectangular body defines the first mounting location, wherein two side parts at opposite sides of the body define second mounting locations, and wherein a first and a second intermediate part are provided between the middle part and the respective opposite side parts.

4. The leaf spring of claim 3, wherein first rectilinear grooves are arranged between the middle part and each intermediate part and between the intermediate parts and the side parts, wherein said rectilinear grooves run parallel to each other, and wherein second rectilinear grooves are arranged on each intermediate part at an angle non-parallel and non-perpendicular to a direction of first rectilinear grooves.

5. The leaf spring of claim 4, wherein said second rectilinear grooves each run on one of the intermediate parts from an end of the first rectilinear groove between the side part and the intermediate part to an end of the first rectilinear groove between the intermediate part and the middle part, wherein the end of the first rectilinear groove between the side part and the intermediate part and the end of the first rectilinear groove between the intermediate part and the middle part are arranged at opposite sides of the body.

6. The leaf spring of claim 1, wherein said grooves form spoke elements extending radially with respect to the first mounting location.

7. The leaf spring of claim 6, wherein a circumference of each of the spoke elements is defined by two rectilinear grooves or slits, and two further grooves or slits extending substantially tangentially with respect to the first mounting location at two different radial distances.

8. The leaf spring of claim 6, wherein said leaf spring comprises at least twelve spoke elements.

9. The leaf spring of claim 6, wherein said spoke elements are substantially divided over 360 degrees about the first mounting location.

10. The leaf spring of claim 6, wherein the second mounting location or locations extend about the circumference of the body.

11. A stage system comprising a first stage part and a second stage part, wherein said first stage part is mounted on said second stage part with one or more leaf springs as claimed in claim 1, wherein said first stage part is connected to the first mounting location of each leaf spring, and wherein the one or more second mounting locations are connected to the second stage part.

12. The stage system of claim 11, wherein said stage system comprises three leafs springs between said first stage part and said second stage part, wherein said three leaf springs are mounted in three different orientations resulting in a stiff mounting between said first stage part and said second stage part in exactly six degrees of freedom.

13. The stage system of claim 11, wherein said first stage part is a mirror block and said second stage part is part of a motor of said stage.

14. The stage system of claim 13, wherein said first mounting location is configured for a bolt or bolt-like connection to the first stage part, and wherein said one or more second mounting locations are configured for a glue connection to the second stage part.

15. A lithographic apparatus comprising:
 an illumination system configured to condition a radiation beam;
 a support constructed to support a patterning device, the patterning device being capable of imparting the radiation beam with a pattern in its cross-section to form a patterned radiation beam;
 a substrate table constructed to hold a substrate; and
 a projection system configured to project the patterned radiation beam onto a target portion of the substrate,
 wherein said lithographic apparatus comprises a stage system as claimed in claim 12.

16. The leaf spring of claim 1, wherein a middle part of the body defines the first mounting location, wherein a side part of the body defines one of said one or more second mounting locations, and wherein an intermediate part is provided between the middle part and the side part.

17. The leaf spring of claim 1, wherein a middle part of the body defines the first mounting location, wherein a side part of the body defines one of said one or more second mounting locations, and wherein at least one of the elongate grooves and/or slits extends from said side part to said middle part.

* * * * *